(12) United States Patent
Rich et al.

(10) Patent No.: US 10,589,998 B2
(45) Date of Patent: Mar. 17, 2020

(54) GRAPHITE ARTICLE

(71) Applicant: NeoGraf Solutions, LLC, Lakewood, OH (US)

(72) Inventors: David G. Rich, Middleburg Hts., OH (US); Martin David Smalc, Parma, OH (US)

(73) Assignee: NeoGraf Solutions, LLC, Lakewood, OH (US)

( * ) Notice: Subject to any disclaimer, the term of this patent is extended or adjusted under 35 U.S.C. 154(b) by 294 days.

(21) Appl. No.: 15/030,948

(22) PCT Filed: Oct. 17, 2014

(86) PCT No.: PCT/US2014/061097
§ 371 (c)(1),
(2) Date: Apr. 21, 2016

(87) PCT Pub. No.: WO2015/069438
PCT Pub. Date: May 14, 2015

(65) Prior Publication Data
US 2016/0280550 A1  Sep. 29, 2016

Related U.S. Application Data

(60) Provisional application No. 61/899,998, filed on Nov. 5, 2013.

(51) Int. Cl.
*C01B 32/20* (2017.01)
*B32B 3/26* (2006.01)
(Continued)

(52) U.S. Cl.
CPC ............ *C01B 32/20* (2017.08); *B32B 3/04* (2013.01); *B32B 3/266* (2013.01); *B32B 7/12* (2013.01);
(Continued)

(58) Field of Classification Search
CPC ............................ C01B 32/20; H01L 23/373
See application file for complete search history.

(56) References Cited

U.S. PATENT DOCUMENTS 5,091,025 A    2/1992  Murakami et al.
6,245,400 B1   6/2001  Tzeng et al.
(Continued)

FOREIGN PATENT DOCUMENTS

CN      103582381        2/2014
EP      1661856 A1       5/2006
(Continued)

OTHER PUBLICATIONS

Extended European search report from EP Application No. 14859920, dated May 17, 2017.
(Continued)

*Primary Examiner* — Gerard Higgins
(74) *Attorney, Agent, or Firm* — Calfee, Halter & Griswold LLP (57) ABSTRACT

A graphite article which can be compressed by more three (3%) percent at a contact pressure of 100 KPa or less without damaging the graphite article reducing the thermal impedance exhibited by the article. Also a graphite article comprising graphitized polymer having a thickness of at least 75 microns. Preferably the graphite has a density of less than 1.50 g/cc and a compressibility of more than 3% at a contact pressure of 100 KPa. Also the article has a generally sheet like shape. These articles may be used in a thermal management system to dissipate heat from a heat source.

20 Claims, 4 Drawing Sheets

(51) Int. Cl.
C04B 35/524 (2006.01)
C04B 35/52 (2006.01)
C04B 35/622 (2006.01)
H01L 23/373 (2006.01)
B32B 7/12 (2006.01)
B32B 9/00 (2006.01)
B32B 3/04 (2006.01)
C04B 35/645 (2006.01)
B32B 18/00 (2006.01)
C04B 41/00 (2006.01)
C09K 5/14 (2006.01)

(52) U.S. Cl.
CPC .............. B32B 9/007 (2013.01); B32B 18/00 (2013.01); C04B 35/522 (2013.01); C04B 35/524 (2013.01); C04B 35/62218 (2013.01); C04B 35/645 (2013.01); C04B 41/0072 (2013.01); C09K 5/14 (2013.01); H01L 23/373 (2013.01); B32B 2307/302 (2013.01); B32B 2307/72 (2013.01); B32B 2457/00 (2013.01); C04B 2235/40 (2013.01); C04B 2235/401 (2013.01); C04B 2235/404 (2013.01); C04B 2235/405 (2013.01); C04B 2235/407 (2013.01); C04B 2235/408 (2013.01); C04B 2235/6562 (2013.01); C04B 2235/6587 (2013.01); C04B 2235/661 (2013.01); C04B 2235/666 (2013.01); C04B 2235/77 (2013.01); C04B 2235/945 (2013.01); C04B 2237/363 (2013.01); C04B 2237/62 (2013.01); C04B 2237/704 (2013.01); H01L 2924/0002 (2013.01)

(56) References Cited

U.S. PATENT DOCUMENTS

| 7,049,021 | B2 | 5/2006 | Sakamoto et al. |
| 7,306,847 | B2 | 12/2007 | Capp et al. |
| 7,758,842 | B2 | 7/2010 | Nishikawa et al. |
| 8,066,966 | B2 | 11/2011 | Nishikawa et al. |
| 8,105,565 | B2 | 1/2012 | Nishikawa et al. |
| 8,987,876 | B2 | 3/2015 | Gowda et al. |
| 9,017,808 | B2 | 4/2015 | Wang et al. |
| 9,258,928 | B2 | 2/2016 | Hill |
| 9,282,681 | B2 | 3/2016 | Rugg |
| 9,330,998 | B2 | 5/2016 | Strader |
| 9,338,927 | B2 | 5/2016 | Mataya |
| 9,408,328 | B2 | 8/2016 | Nigen et al. |
| 9,609,744 | B2 | 3/2017 | Hoffmeyer |
| 2003/0160319 | A1 | 8/2003 | Zheng et al. |
| 2003/0180597 | A1 | 9/2003 | Sakamoto et al. |
| 2004/0121122 | A1 | 6/2004 | Reynolds, III |
| 2006/0171124 | A1 | 8/2006 | Capp et al. |
| 2008/0050305 | A1 | 2/2008 | Nishikawa et al. |
| 2010/0129648 | A1 | 5/2010 | Xu |
| 2010/0187680 | A1 | 7/2010 | Otsuka |
| 2011/0045300 | A1 | 2/2011 | Tamaoki et al. |
| 2013/0199752 | A1 | 8/2013 | Colgan et al. |
| 2013/0213630 | A1 | 8/2013 | Southard, II |
| 2013/0308274 | A1 | 11/2013 | Murdock |
| 2015/0334871 | A1 | 11/2015 | Hill |

FOREIGN PATENT DOCUMENTS

| JP | 07109171 A | * | 4/1995 |
| JP | H070109171 | | 4/1995 |
| JP | 10-56114 H | | 2/1998 |
| JP | 10168502 A | * | 6/1998 |
| JP | 2000169125 A | | 6/2000 |
| JP | 2000178016 A | | 6/2000 |
| JP | 2001068608 | | 3/2001 |
| JP | 2003-092384 | | 3/2003 |
| JP | 2008080672 | | 10/2008 |
| TW | 2006/37475 | | 10/2006 |
| WO | 2015/120773 A | | 8/2015 |

OTHER PUBLICATIONS

International Search Report filed in PCT/US14/61097 dated Jan. 12, 2015.
"The Bending of Bonded Layers Due to Thermal Stress" by Ahmad T. Abawi, Hughes Research Laboratories, Malibu, CA Oct. 23, 2004.
Marotta, E.E., et al., "The Effect of Interface Pressure on Thermal Joint Conductance for Flexible Graphite Materials: Analytical and Experimental Study" ITherm 2002, May 30-Jun. 1, 2002.
Panasonic, "Soft-PGS (Compressible Type)" PGS with low thermal resistance, Sales Brochure, Dec. 2, 2016.
Exam Report from European Application No. 14859920.2 dated Feb. 5, 2019 (6 pages).
PGS Graphite Sheet, https://www.alliedelec.com/mkt/pb/panasonic/pdfs/Thermal%20Graphite%20PGS%20Presentation%20120110.pdf, Panasonic, pp. 1-16, publicly available prior to Nov. 5, 2013.

* cited by examiner

GRAPHITE ARTICLE

This application claims priority to U.S. Provisional App. No. 61/899,998, filed on Nov. 5, 2013. The benefit of priority to the aforementioned application is hereby claimed under at least 35 U.S.C. § 365.

The article described herein relates generally to the field of graphite articles, in particular graphite articles which may have applications in thermal management systems.

TECHNICAL BACKGROUND

Graphite articles have been used in the thermal management for various devices. Such prior uses of graphite have included the dissipation of heat in the z direction away from the heat source or the spreading of heat in x-y direction away from a hot spot exhibited on the heat source.

In the case of dissipating heat in the z direction, conventional wisdom is to minimize the distance between the heat source and the heat dissipation element. This is accomplished by minimizing the thickness of the graphite article and in accordance with conventional wisdom thereby minimizing the thru-body thermal impedance of the article.

BREIF DESCRIPTION

An embodiment included herein is a graphite article which can be compressed by more three (3%) percent at a contact pressure of 100 KPa or less without damaging the graphite article reducing the thermal impedance exhibited by the article.

Another embodiment includes a graphite article comprising graphitized polymer having a thickness of at least 50 microns. Preferably the graphite has a density of less than 1.50 g/cc and a compressibility of more than 3% at a contact pressure of 100 KPa. Also the article has a generally sheet like shape.

It is to be understood that both the foregoing brief description and the following detailed description provide embodiments of the disclosure and are intended to provide an overview or framework of understanding to nature and character of the invention as it is claimed.

DETAILED DESCRIPTION

An article disclosed herein includes a graphite article having a generally sheet like shape. The article comprises a graphitized polymer having a thickness of at least 50 microns preferably at least 75 microns. The thickness of the article may range upwards to 300 microns, and in other examples upwards to 500 microns. Optional exemplary thickness can include at least 75 microns, at least 100 microns, at least 150 microns, at least 200 microns, at least 250 microns or any other desired thickness. The density of the graphite is typically less than 1.50 g/cc. For any given embodiment of the article the density may range from less than 1.25 g/cc to about 0.3 g/cc, as desired for the end application. It should be understood that all densities between such range end points are disclosed herein and are possible. Exemplary densities include less than 0.4 g/cc, less than 0.5 g/cc, less than 0.6 g/cc, less than 0.7 g/cc, less than 0.85 g/cc, less than 1.0 g/cc and less than 1.25 g/cc.

The article has a compressibility of more than 3% at a contact pressure of 100 KPa. Exemplary compressibility for a given embodiment may range from more than 3% to up to 75%. Particular examples of compressibility include more than 5%, more than 10%, more than 20%, more than 25%, more than 30%, and up to 65%. To provide a non-limiting example of meaning of the compressibility numbers, if the compressed thickness is 35% of the original thickness, the article has exhibited a compressibility of 65%.

The testing of the compressibility of the article is not limited to any particular method or apparatus. Exemplary apparatuses that may be used to test compressibility include a Greening Model 1140 Compressibility Test Machine and Test Machine Inc. ("TMI") Compression Tester Models 17-76 or 17-77. This reduction in thickness may be a permanent reduction in thickness without rupture or other destruction of the article. In the case compressibility is measured by measuring a change in thickness of the article, a Mahr Extreme Thickness Test Instrument may be used.

Figure 4:
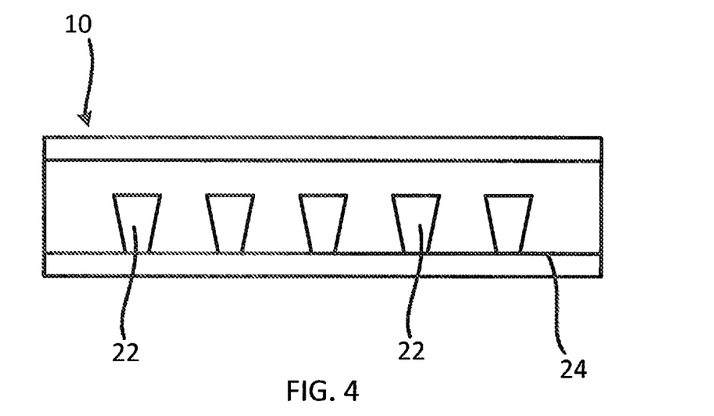
FIG. 4 is a side view of another article described herein.

Optionally, the article may include one or more dopants. One such dopant may be a conductive polymer, another dopant may include an EMI modifier. Examples of EMI dopants include nickel, copper, mu-metals and combinations thereof. Mu-metals are nickel-iron alloys which have high magnetic permeability. The conductive polymer may also have the beneficial property of wetting out on the surface of the article. Non-limiting examples of the polymer may include oil or a polymer filled with a conductive material. Other dopants include a phase change material or a dielectric material. In the case of the article including an oil, a grease or a phase change material (non-limiting example a wax) it is preferred that the article includes a sufficient amount of oil, grease or phase change material to reduce the contact resistance the article would exhibit in an application as a thermal interface between one or more heat sources and a heat dissipating element. The dopants may be in the form of a liquid, particles, powder or filaments. A non-limiting exemplary embodiment is that the article includes at least 5% by weight of the dopant. When the article includes a dopant, one or more surfaces of the graphite which make up the article may include perforations, notches, cutouts and combinations thereof. This may be referred to as alternations. Preferably the alterations are sized, shaped and located to assist with mechanical inclusion of the dopant in the graphite. Examples of functions of the alternations include that they may be used to impregnate the entire article with the dopant or two locate the dopant on one or more surfaces of the article. Article 10 is shown in FIG. 4 having a plurality of cut outs 22 on a major surface 24 of article 10. As shown the cutouts have a substantially dove tail configuration. The cutouts contemplated herein are not limited to any particular orientation.

Once again when used in a thermal interface application, the article may exhibit a resistivity of less than 0.019° C./W at a contact pressure of at least 200 KPa. Examples of suitable resistivity include less than 0.015° C./W, less than 0.010° C./W, and less than 0.08° C./W, as measured on an apparatus that meets the requirements of ASTM D5470 Standard Test Method.

At a contact pressure of at least 700 KPa, the graphite article exhibits a total thermal impedance of no more than 0.25 cm$^{2o}$ C./W, preferably no more than 0.20 cm$^{2o}$ C./W. Total thermal impedance is a measure of the contact impedance and the thru-body impedance an article exhibits.

In another embodiment, as the contact pressure increase from 100 KPa to 700 KPa, the total thermal impedance exhibited by the graphite article reduces by a factor of at least 6, preferably at least 7, even more preferred at least 8.

Another advantage of the afore noted graphite article is that as the contact pressure exerted on the article may increase the in-plane thermal conductivity of the article. For example as the contact pressure increases from 100 KPa to 700 KPa, the in-plane thermal conductivity exhibited by the article may increase at least 1.25 times, preferably at least 1.5 times, more preferably up to at least 2 times.

The article may be a monolithic article; monolithic is used herein to mean that the article does not include multiple sheets of graphite to achieve the desired thickness. Alternatively stated, the article may consist essentially of a single sheet of graphite. A further way to state this is that the article may be devoid of more than one sheet of graphite.

In a different embodiment, the article may comprise more than one of the aforementioned graphite sheets. Preferably each graphite sheet is oriented such that the x-y plane of the each individual graphite sheet is in the horizontal direction of the article and not in the vertical direction of the article. The various sheets may be stacked to any desired thickness. In such an embodiment, optionally, a thermoplastic sheet may be disposed between adjacent graphite sheets. In the case of an article that includes "N" number of graphite sheets, the article may include up to "N−1" thermoplastic sheets, wherein each thermoplastic sheet is disposed between two (2) different graphite sheets.

Figure 1:
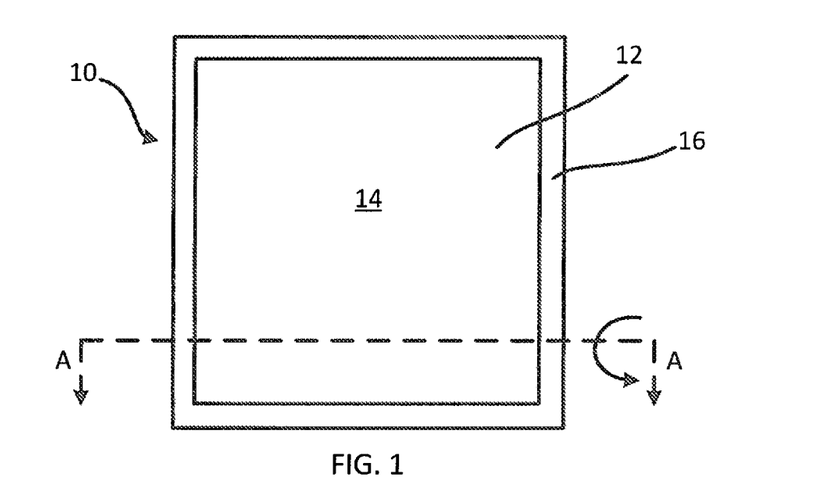
FIG. 1 is a top view of an article described herein.
Figure 2:
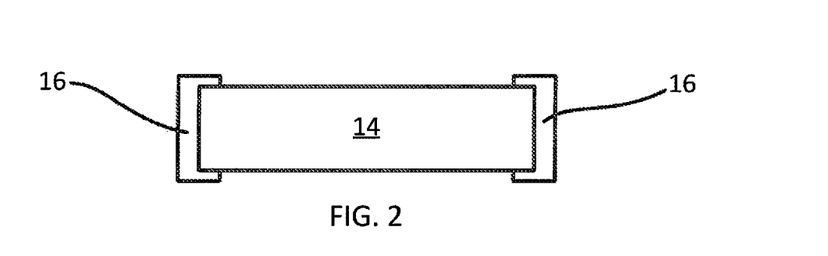
FIG. 2 is a cross sectional view along line A-A of FIG. 1 rotated along arrow B.
Figure 3:
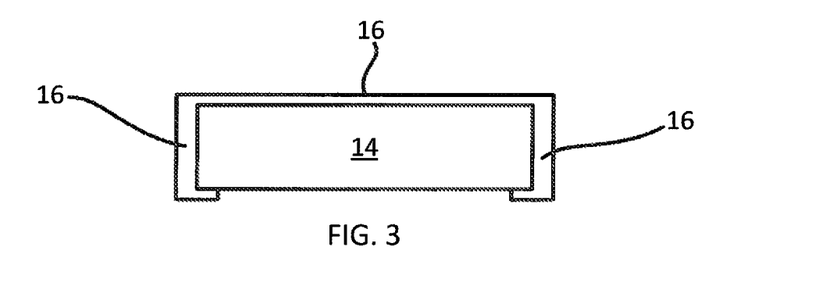
FIG. 3 is a cross sectional view along line A-A of FIG. 1 rotated along arrow B of an alternate embodiment of FIG. 2.

The article is not limited to only including graphite. The article may include an adhesive on one or more of the surfaces of the article. For example, the article may include an adhesive on one or more of the major surface of the article. The adhesive may be applied completely on one of the major surface of the article. Alternatively the adhesive may be applied in a picture frame orientation, such as to a sufficient exterior portion of the perimeter of the major surface as shown in FIGS. 1 and 2. As illustrated in FIG. 1, article 10 includes a graphite sheet 12, with a major surface 14. Adhesive 16 is applied to a perimeter section of major surface 14. FIG. 2 is a cross-sectional view along line A-A of FIG. 1 and rotated in the direction of arrow B. In another embodiment, the adhesive may be applied to three (3) or less of the edge sections of the perimeter of the major surface, as shown in FIG. 3. If so desired the article 10 may be sized such that the heat source may engage adhesive 16 or that the heat source will fit inside of the adhesive to directly engage the exterior graphite portion of article 10.

The article may alternatively or in combination with the adhesive include a first thermoplastic layer on one of the major surfaces of the article. A second thermoplastic layer may be on the other major surface of the article. If so desired the first, second, or both thermoplastic layers may form an exterior surface of the article. In a particular embodiment of the article, the thermoplastic layer will not be located on a major surface disposed in thermal contact with a heat source. Stated another way, the thermoplastic layer may be disposed on the major surface planned to be opposed to the heat source.

In a further particular embodiment, if so desired, the article may be envelope sealed with the thermoplastic. Envelope sealed can be used to describe when the thermoplastic layers extend beyond the edges of the graphite sheet, such that the graphite sheet of the article is hermetically enclosed in the thermoplastic sheets. In a particular envelope sealed embodiment, the thermoplastic sheet or sheets may form a frame around the a desired portion of the perimeter of the article, thereby leaving an central portion of the graphite article on each major surface not covered by a thermoplastic layer. Optionally, only one major surface of the graphite article may be covered with the aforementioned frame envelope seal.

In a particular embodiment, the article has a bond line thickness of less than 0.127 mm. The bond line thickness is the entire thickness of the article.

The article may be included in a thermal management system. One major surface of the article has a substantially similar contact surface area as a contact surface area of a heat source to which that the article is in thermal contact with. A non-limiting list of examples of heat sources include electronic components such as CPUs, GPUs, a driver chip, a memory chip, RF power amplifiers, transceivers, DC/DC switchers, PMIC (Power Management IC), Buck and/or Boost inductors, power converters, wireless charging elements, image processing and stabilizing elements, still or video image lighting sources, LEDs, disk drives, and CD/DVD/Blue-Ray drives. Preferably, the second major surface of the article may be in thermal contact with a heat dissipation element. Non-limiting examples of a heat dissipation element include a heat sink, a heat spreader, a heat pipe, a cold plate, a frame for an electronic device, a chassis for an electronic device. The article is equally applicable to lighting applications, telecommunications applications as well as OLED devices. In a further alternate embodiment, the contact surface of the article may be larger than the contact surface area of the device in which it is in contact.

The above article may be incorporated into an electronic device in various ways. A few examples of how the article may be used in such a device will be discussed below.

Figure 6:
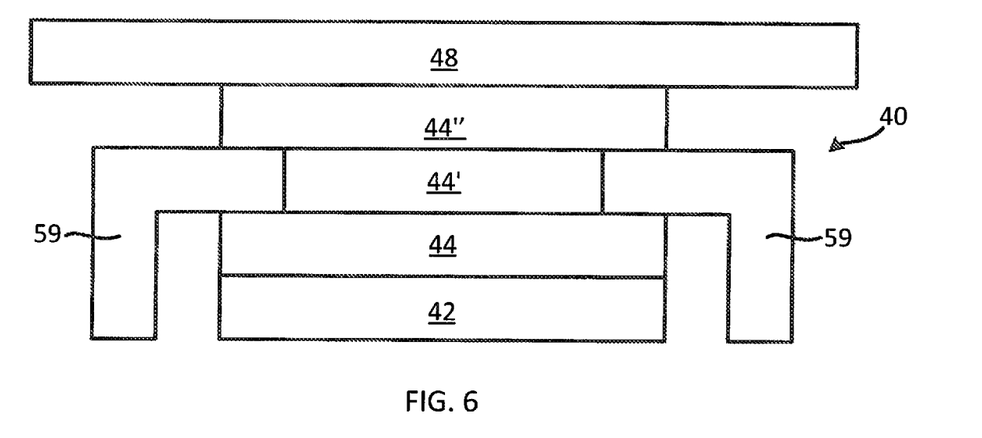
FIG. 6 is a schematic view of another embodiment of a thermal management system which includes the graphite article.

Shown in FIG. 6 is a thermal management system 40 for an electronic device. Thermal management system 40 dissipates heat from heat source 42, the heat source may be any one of the above examples of a heat source. In system 40, a graphite article 44 is in thermal contact with heat source 42. The system may further include one or more further graphite articles 44. As shown, each graphite article 44 is in thermal communication with another graphite article 44. As shown the adjacent graphite articles do not have major surfaces with the same area. As shown the middle graphite article 44' is disposed in alignment with the top surface of an RF can 46. Graphite article 44' may be sized to fit through an opening in can 46. As shown each major surface of graphite article 44' is not sized to have substantially the same surface area as that of the graphite articles 44 and 44" which it is in thermal communication. Lastly, the graphite articles 44 most opposed to heat source 42 can be in thermal communication with a heat dissipation element 48. As shown the graphite article 44" optionally does not need to have a major surface with the same surface area as the heat dissipation element it is in thermal contact with. The heat dissipation element may have a surface having a larger surface area than the surface area of the major surface of graphite article 44" in thermal contact with element 48.

Figure 5:
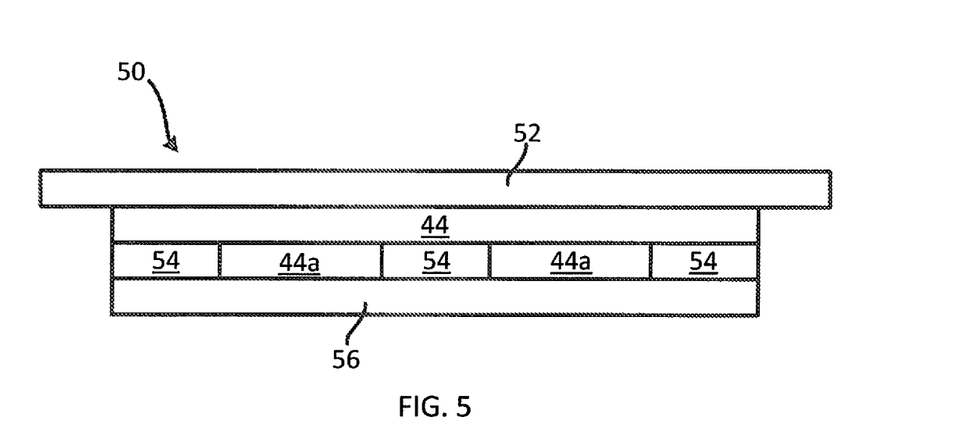
FIGS. 5-5(*c*) are schematic views of various embodiments of a thermal management system which include the graphite article disclosed herein.

Another version of a thermal management system 50 is shown in FIG. 5. Thermal management system 50 may include a heat dissipation element 52. Dissipation element 52 may be in contact with a graphite article 44. In system 50, instead of having element 44', system 50 includes a layer of material having one of smaller versions of article 44, noted as element 44a and one of more gap pads 54. As shown the layer may include two (2) graphite articles 44a and three (3) gap pads 54. The layer of embodiment 50 may include any desired combination and orientation of gap pads 54 and graphite articles 44a.

System 50 may also include a contact element 56 in thermal communication with the layer. The contact element may include any one of the following or a combination thereof, an isotropic material, a laminate of a isotropic material and the graphite article, a laminate of the graphite article-the isotropic material-the graphite article, or a laminate of the graphite article-an isotropic material-the graphite article having a dopant on or in the graphite article in closest to the heat source. Examples of the isotropic material may include any type of metal or metal alloy, such as but not limited to steel, aluminum, copper, alloys thereof and combinations thereof. Contact element 56 is in thermal contact with a heat source.

Figure 5A:
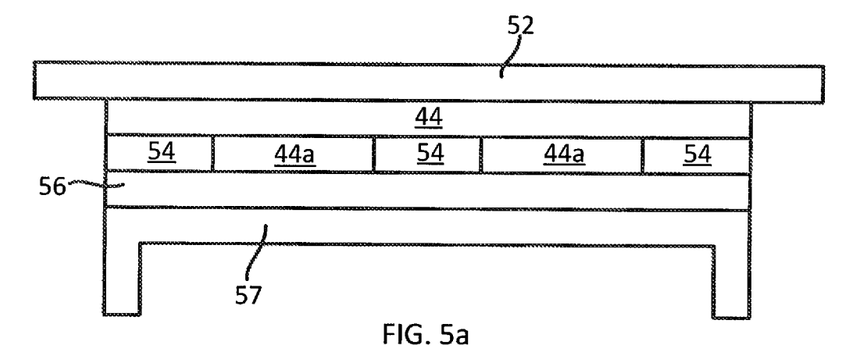
Figure 5B:
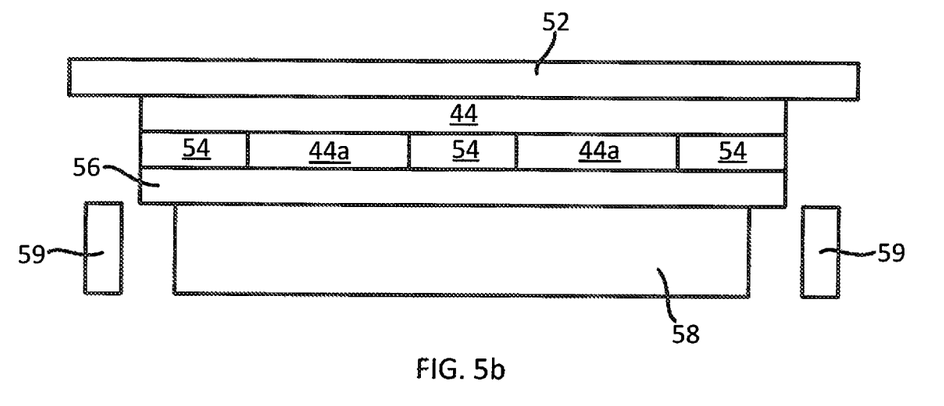
Figure 5C:
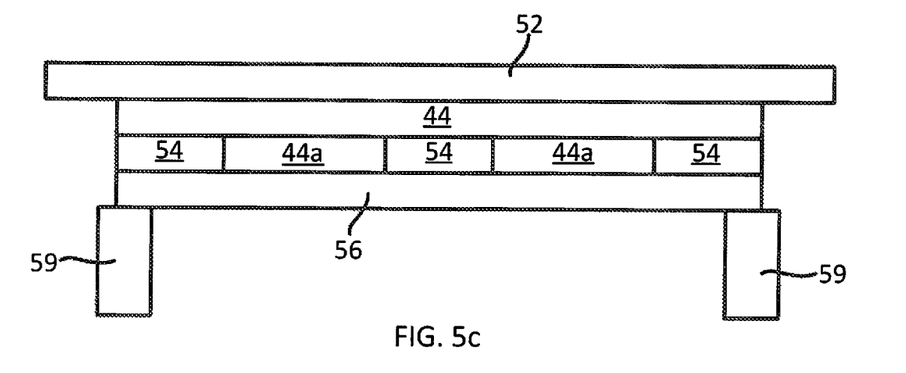

In FIG. 5(a), system 50 is in thermal contact with the top of an RF can lid 57. In FIG. 5(b) system 50 is thermal contact with a top surface of a heat source 58. Also shown in FIG. 5(b) is a pair of RF can sidewalls 59 are adjacent heat source 58. The thermal system 50 may or may not be in contact with the pair of RF can sidewalls. Having thermal system 50 in contact with the RF can sidewalls 59 is shown in FIG. 5(c).

If so desired, the article may include a phase change material such as a wax or any other known phase change materials. Other materials which may be included in the article include a grease, an oil or a polymer. If so desired such materials may be used in combination. The material may be coated onto the article and/or impregnated into the article.

Also disclosed herein is a method of making an electronic device. The method may include disposing the article in operative thermal contact to one of a heat source or a heat dissipation element. Next the article is disposed in operative thermal contact to the other of the heat source or the heat dissipation element not attached to in the prior step. The attaching results in the article being compressed by at least 3% with a contact pressure of at least 50 KPa. The compression of the article may be by at least 10%. The article itself may be by at least 20 microns. Examples of the amount of compression of the article may be at least 50 microns, at least 75 microns, at least 100 microns. The amount of compression may be determined by the change in thickness of the article. Operative thermal contact is used herein to mean that the article receives heat from the heat source in the first step above and in the second step it transmits heat which eventually is transmitted to the heat dissipation element. Stated another way, the article facilitates the heat path from the heat source to the heat dissipation element. The article may be in actual physical contact with either or both of the heat source, but such physical contact is not required to practice the above method.

Also disclosed herein is an article that may be used as a thermal interface. The article will have a density of less than 1.50 g/cc, a thickness of at least 75 microns, a through plane conductivity of greater than 2 W/mK and a compressibility of at least 3%, preferably a compressibility of at least 5%. The thermal conductivity preferably may be at least 3 W/mK, more preferably at least 5 W/mK. The above description of properties regarding density, thickness and compressibility are equally applicable to this embodiment and are incorporated herein by reference as if fully written. ASTM D5470 may be used to determine the aforementioned thermal conductivity at a contact pressure of at least 50 KPa. In a further embodiment, the aforementioned density may be no more than 1.25 g/cc.

Various methods which can be used for making a graphite article having graphitized polymer are disclosed below.

A process for making a graphite film may comprises the following three steps: (1) providing a polymer film wherein the polymer selected should be graphitizable; (2) thermally treating the polymer film at a defined range of temperature under pressure conditions to obtain a graphite film; and (3) subjecting the graphite film to rolling.

In the first step, there is provided a polymer film selected from polyamide (PA), polyphenyleneoxadiazoles, polyoxadiazole (POD), polybenzothiazole (PBT), polybenzobisthiazole (PBBT), polybenzoxazole (PBO), polybenzobisoxazole (PBBO), polyimide (a non-limiting example being a poly(pyromellitimide)) (PI), poly(phenyleneisophthalamide) (PPA), polybenzimidazole, polybenzobisimidazole, poly(phenylenebenzoimidazole) (PBI), poly(phenylenebenzobisimidazole) (PPBI), polythiazole (PT), and poly(para-phenylenevinylene) (PPV) and combinations thereof. The polyphenyleneoxadiazoles include poly-phenylene-1,3,4-oxadiazole and isomers thereof.

In one embodiment, the starting film may have a thickness of up to 400 μm. A range of typical examples of the thickness of the starting film may be from 25 to 200 μm.

The starting polymer film is thermally treated at a final treating temperature of not lower than 2400° C. The starting film may be pre-heated for carbonization prior to the final thermal treatment. For instance, the film may be pre-heated at a heating rate of 2° to 50° C./min up to 1000° C. and kept at the temperature for a time sufficient for the carbonization. The pre-heating is preferably done in an inert gas such as nitrogen, argon or the like. The time for the thermal treatment at 2400° C. or higher can vary depending on the actual temperature used and the type of starting film.

For thermal treatment in a temperature range over 1600° C., this may occur in an inert gas of the type as mentioned above at normal pressures or under pressure. Examples of The pressures that may be used for the treatment are generally in the range of from 0.1 kg/cm$^2$ to 50 kg/cm$^2$. The pressure may be applied isotropicly, in a manner that allows the formation of a graphite film which is foamed owing to the generation of gas but the foaming is generally uniform as a whole.

The graphitized film may be subjected to rolling. The rolling procedure is usually carried out by calendaring the film. The rolling may be conducted at normal temperatures or elevated temperatures and optionally at a linear or nip pressure of not less than 2 kg/cm.

Another method for making the graphite film includes the step of holding the polymeric film in a vessel being directly electrifiable by voltage application; and graphitizing the polymeric film in the vessel by applying a voltage to the vessel so as to carry out electrification. This results in voltage application to and electrification of the polymeric film thereby causing heat generation of the polymeric film. As a result, an electric resistance is lowered as the polymeric film is carbonated. As the electric resistance is lowered, current flows through the polymeric film. Due to the resultant Joule heat, heat is generated in the raw material. As a result, an inside and a surface portion of the film are uniformly heated. The electrifiable vessel also heats the film from the film's surrounding sufficiently and uniformly.

The carbonized polymeric film can be obtained by pre-heating a polymeric film, which is a starting material, under reduced pressure or an inert gas. The preheating may be carried out at a temperature of approximately 1000° C. For example, it is preferable that the polymeric film is heated at a temperature of approximately 1000° C. for 30 minutes with a ramp rate of 10° C./minute.

The vessel may further include carbon powder inside the vessel. The carbon powder may be used to fill the void space between the vessel and the polymeric film. This may further enhance conductivity of the electricity to the polymeric film. Thus the carbon powder may function as a conductor, conducting electrical energy into the polymeric film.

In addition to the above or alternatively, the polymeric film may be sandwiched by metal plates or graphite plates, and the sandwiched polymeric film thus sandwiched and brought into contact with a wall or the bottom of the vessel, and optionally any carbon powder included in the vessel. Except for weight of the metal plates or graphite plates, no particular additional pressure need be exerted on the polymeric film. In one particular embodiment which includes carbon powder, the powder may be fully around the interior of the vessel. Stated another way, the polymeric films are held respectively in directly electrifiable vessels and the carbon powder is provided on and around the inner portion of the directly electrifiable vessels so as to fill gaps between the polymeric film and the electrifiable vessel.

The voltage that may be applied may be either AC or DC voltage. An example of a current that may be used is a current of 10 mA or greater flows into the polymeric film as a result of the electrification. The aforementioned current is just an exemplary embodiment and other currents are equally applicable.

A further process for producing a graphite film includes thermal treating a polymer film at a temperature of 2,000° C. or more, the process comprising the step of bringing a polymer film into contact with a substance containing a metal during thermal treatment. An alternative process for producing a graphite film in which a polymer film is thermally treated at a temperature of 2,000° C. or more, includes the step of bringing a carbonized polymer film into contact with a substance containing a metal during thermal treatment. Further for producing a graphite film in which a polymer film is brought into contact with a container and thermally treated at a temperature of 2,000° C. or more, wherein the container contains a metal. The container can be a closed container.

The phrase "the container can be closed" means that the film can be surrounded on four or six sides by the container so that the polymer film and/or the carbonized polymer film can be sufficiently brought into contact with a substance containing a metal. Atmospheric gas around the polymer film and/or the carbonized polymer film may be expanded as the temperature is increased. It is preferable to ensure a place where the atmospheric gas can escape. Accordingly, the phrase "the container can be closed" in the present invention does not mean that the container is in a completely closed state in which the container is broken by the pressure of expanded atmospheric gas.

The aforementioned metal may be one or more selected from the group consisting of elements of Groups 4, 5, 6, 7, 8, 9, 10, 11, 12 and 13 such as aluminum and boron according to the IUPAC (International Union of Pure and Applied Chemistry) Nomenclature of Inorganic Chemistry, revised edition (1989), lithium, beryllium, sodium, magnesium, potassium, calcium, barium, silicon, germanium, selenium, tin, lead and bismuth and combinations thereof.

Further the metal may be one or more selected from the group consisting of titanium, vanadium, chromium, manganese, iron, cobalt, nickel, copper, zinc, zirconium, niobium, molybdenum, technetium, ruthenium, rhodium, palladium, silver, cadmium, hafnium, tantalum, tungsten, rhenium, osmium, iridium, platinum, gold, mercury and combinations thereof.

The thermal treatment may have a step of carbonizing a polymer film and a step of graphitizing the polymer film. Carbonization and graphitization may be performed either separately or continuously.

Carbonization is performed by pre-heating a polymer film as a starting material under reduced pressure or in nitrogen gas. The pre-heating is carried out typically at a temperature of 800 to 1,500° C. The highest temperature of carbonization may be maintained for about 30 minutes to one hour after reaching the highest temperature. For example, when the film is heated at a rate of 10° C./min, the temperature of the film may be maintained in a temperature range of 1,000° C. for about 30 minutes. Optionally pressure may be applied in the direction perpendicular to the film surface.

Graphitization may be carried out by once removing a carbonized polymer film and transferring the film in a graphitization furnace, or may be carried out continuously from carbonization. Graphitization is carried out under reduced pressure or in an inert gas. Argon or helium is appropriate for the inert gas. The thermal treatment temperature may be at least 2,000° C. or more. The final thermal treatment temperature is preferably 2,400° C. or more, more preferably 2,600° C. or more, and still more preferably 2,800° C. or more.

The thermal treatment may be carried out by fixing the polymer film to a container. The container may be made of graphite. Graphite herein includes, in a broad sense, a material containing graphite as a main component insofar as the material can be heated to the above temperature range. Graphite may be isotropic graphite or extruded graphite, for example. When graphite is repeatedly used, isotropic graphite having excellent electrical conductivity, thermal conductivity and uniformity is preferable. The container may have any shape such as a shape of a simple flat plate. The container may also have a shape of a cylinder, and the polymer film may be wound around the container. The shape of the container is not specifically limited insofar as the polymer film can be brought into contact with the container.

The method of bringing the polymer film into contact with the inside of a container made of graphite (including a method of holding or fixing the film) may be each of a method of sandwiching the polymer film in a graphite or metal plate and bringing the film into contact with the wall or bottom of the container while pressure other than the own weight of the plate is not applied to the polymer film (in which the polymer film may be held by or fixed to the container) and a method of winding the polymer film around a cylindrical graphite container. However, the method of making the article is not necessarily limited to these methods.

A polymer film may be graphitized by two steps of carbonization and graphitization. First, carbonization generally refers to a process in which a polymer film is thermally treated to 1,000° C. to convert the film into a substance containing carbon as a main component. Specifically, when the polymer film is thermally treated at a decomposition temperature, the bond is cleaved and the decomposed component leaves as a gas such as carbon dioxide, carbon monoxide, nitrogen or hydrogen. When the film is thermally treated to 1,000° C., the film is a material containing carbon as a main component. Second, graphitization refers to a process in which a carbonaceous material is thermally treated at a temperature of 2,800° C. or more to convert the material into a structure having many graphite layers stacked, each layer of which has aromatic rings flatly connected with each other.

The material described herein may have any to all of the following advantages: low contact resistance, excellent thru-thickness thermal conductivity, high in-plane thermal conductivity and relatively high bond line thickness. One advantageous is as a large area thermal interface material. Other advantageous of the material include lower thermal resistance, increased compressibility and higher in-plane thermal conductivity than conventional thermal interface materials.

Applications for the article may include being used as a thermal interface in such environments as consumer electronics, white goods, drivetrains for automotive, commercial or locomotive vehicles, telecommunications, thermo-electronic devices, and industrial equipment.

The above description is intended to enable the person skilled in the art to practice the invention. It is not intended to detail all the possible variations and modifications that will become apparent to the skilled worker upon reading the description. It is intended, however, that all such modifications and variations be included within the scope of the invention that is defined by the following claims.

Thus, although there have been described particular embodiments of the present invention of a new and useful applications of a graphite article and how to make such graphite article, it is not intended that such references be construed as limitations upon the scope of this disclosure except as set forth in the following claims The various embodiments discussed above may be practiced in any combination thereof.

What is claimed is:

1. A graphite article comprising a single sheet of a graphitized polymer having a thickness of more than 150 microns, the graphite article having a density of less than 1.00 g/cc, a compressibility of more than 10% and up to 75% at a contact pressure of 100 kPa, and a thermal impedance of no more than 0.25 cm$^{2\circ}$ C./W at a contact pressure of at least 700 kPa.

2. The graphite article of claim 1 wherein the thickness comprises up to 500 microns.

3. The graphite article of claim 2 further comprising a dopant in a concentration of at least 5 percent by weight.

4. The graphite article of claim 3 further comprising surface perforations.

5. The graphite article of claim 3 wherein the dopant comprises a conductive polymer.

6. The graphite article of claim 3 wherein the dopant comprises an EMI modifier.

7. The graphite article of claim 6 wherein the dopant comprises nickel, copper, mu-metals or combinations thereof.

8. The graphite article of claim 2 wherein the thickness comprises at least 200 microns.

9. The graphite article of claim 1 having a resistivity of less than 0.010 (° C./W) at a contact pressure of at least 200 KPa.

10. The graphite article of claim 1 further comprising a graphitized polymer having no dopant.

11. The graphite article of claim 1 having a resistivity of less than 0.019 (° C./W) at a contact pressure of at least 200 KPa.

12. The graphite article of claim 1, wherein as the contact pressure of the graphite article increases, the in-plane thermal conductivity increases.

13. The graphite article of claim 12, wherein as the contact pressure of the graphite article increases from 100 KPa to 700 KPa, the in-plane thermal conductivity increases by at least 1.25 times.

14. The graphite article of claim 13, wherein as the contact pressure of the graphite article increases from 100 KPa to 700 KPa, the in-plane thermal conductivity increases up to 2 times.

15. The graphite article of claim 1, wherein the graphite article has a compressibility of more than 20% and less than 65% at a contact pressure of 100 KPa.

16. A compressible graphite article comprising a graphitized polymer sheet having a thickness of at least 200 microns, a density of less than 1.00 g/cc, and a thermal impedance of no more than 0.25 cm$^{2\circ}$ C./W at a contact pressure of at least 700 kPa.

17. The graphite article of claim 16 wherein the thickness comprises up to 300 microns.

18. The graphite article of claim 16 having a resistivity of less than 0.019 (° C./W) at a contact pressure of at least 200 KPa.

19. The graphite article of claim 16, wherein as the contact pressure of the graphite article increases, the in-plane thermal conductivity increases.

20. The graphite article of claim 16, wherein as the contact pressure of the graphite article increases from 100 KPa to 700 KPa, the in-plane thermal conductivity increases by at least 1.25 times.

* * * * *